(12) United States Patent
Imai et al.

(10) Patent No.: US 7,643,531 B2
(45) Date of Patent: Jan. 5, 2010

(54) OPTICAL SEMICONDUCTOR ELEMENT INCLUDING PHOTODETECTING ELEMENT WITH COMB-TOOTH STRUCTURE

(75) Inventors: Yasutaka Imai, Chino (JP); Tsuyoshi Kaneko, Shimosuwa (JP); Atsushi Sato, Azumino (JP)

(73) Assignee: Seiko Epson Corporation (JP)

( * ) Notice: Subject to any disclaimer, the term of this patent is extended or adjusted under 35 U.S.C. 154(b) by 224 days.

(21) Appl. No.: 11/610,694

(22) Filed: Dec. 14, 2006

(65) Prior Publication Data

US 2007/0138486 A1    Jun. 21, 2007

(30) Foreign Application Priority Data

Dec. 20, 2005   (JP)   ............................. 2005-366246

(51) Int. Cl.
*H01S 3/097* (2006.01)
*H01S 5/00* (2006.01)
(52) U.S. Cl. .................. 372/87; 372/50.21; 372/50.124
(58) Field of Classification Search .................... 372/87, 372/50.21, 50.124
See application file for complete search history.

(56) References Cited

U.S. PATENT DOCUMENTS

| | | | | |
|---|---|---|---|---|
| 6,054,716 A | * | 4/2000 | Sonobe et al. | ............... 250/552 |
| 2005/0180481 A1 | * | 8/2005 | Kaneko et al. | ........... 372/50.21 |

FOREIGN PATENT DOCUMENTS

| | | |
|---|---|---|
| JP | 2000-269585 | 9/2000 |
| JP | 2005-33106 | 2/2005 |
| JP | 2006-339487 | 12/2006 |

* cited by examiner

*Primary Examiner*—Minsun Harvey
*Assistant Examiner*—Marcia A. Golub
(74) *Attorney, Agent, or Firm*—Harness, Dickey & Pierce, P.L.C.

(57) ABSTRACT

An optical semiconductor element includes: a surface-emitting type semiconductor laser that emits laser light; a photodetecting element formed above the surface-emitting type semiconductor; a first electrode of a first polarity formed on the surface-emitting type semiconductor laser; a second electrode of a second polarity different from the first polarity formed on the photodetecting element; and an additional electrode that covers the first electrode and the second electrode.

1 Claim, 10 Drawing Sheets

OPTICAL SEMICONDUCTOR ELEMENT INCLUDING PHOTODETECTING ELEMENT WITH COMB-TOOTH STRUCTURE

The entire disclosure of Japanese Patent Application No. 2005-366246, filed Dec. 20, 2005 is expressly incorporated by reference herein.

BACKGROUND

1. Technical Field

The present invention relates to optical semiconductor elements that emit laser light and methods for manufacturing the same.

2. Related Art

A surface-emitting type semiconductor laser is one type of optical semiconductor elements that emit laser light. The surface-emitting type semiconductor laser is provided with a resonator formed in a direction orthogonal to a surface of the substrate, and emits laser light from the substrate. Compared to conventional edge-emitting type semiconductor lasers that use parallel cleavage surfaces of a substrate as a resonator, the surface-emitting type semiconductor laser has various favorable characteristics. For example, surface-emitting type semiconductor lasers have low power consumption, and are capable of high-speed direct modulation, and a two-dimensional laser array structure can be readily formed with surface-emitting type semiconductor lasers. Therefore, surface-emitting type semiconductor lasers are highly expected as light sources that are suitable for optical interconnections that handle a great amount of data. Currently, surface-emitting type semiconductor lasers with oscillation wavelengths being centered at the 850 nm range are coming into full scale application to modules (optical interconnection modules), and their further miniaturization and cost reduction are desired.

An optical transmission module, represented by a transmitter optical sub-assembly (TOSA), is equipped with a surface-emitting type semiconductor laser, a reflection member that reflects a portion of laser light emitted from the surface-emitting type semiconductor laser, such as, a diagonal glass, and a photodetector element that detects the laser light reflected by the reflection member. Driving current for the surface-emitting type semiconductor laser is feed-back controlled based on the detection result provided by the photo-detector element. This structure realizes constant optical output driving (or automatic power control (APC)) that maintains constant the power of laser light emitted from the surface-emitting type semiconductor laser.

However, the optical transmission module described above requires highly accurate positioning in order to increase the coupling efficiency with respect to the photodetector element that detects laser light reflected by the reflection member. Also, because the optical transmission module requires the reflection member, the photodetecting element and other elements besides the surface-emitting type semiconductor laser, the number of components increases, and therefore the cost increases. In order to suppress the cost increase by reducing the number of components of an optical transmission module, an optical semiconductor element that integrates a surface-emitting type semiconductor laser and a photodetector element that monitors the amount of laser light emitted from the surface-emitting type semiconductor laser in one piece has been recently proposed.

For example, Japanese laid-open patent applications JP-A-2005-33106 and JP-A-2000-269585 describe an optical semiconductor element equipped with a photodetecting element provided above a surface-emitting type semiconductor laser. The structure of the optical semiconductor element described in JP-A-2005-33106 is briefly described below. The surface-emitting type semiconductor laser of the optical semiconductor element is formed by sequentially laminating, for example, an n-type first mirror composed of a semiconductor multilayer film, an active layer and a p-type second mirror composed of a semiconductor multilayer film. Also, the photodetecting element is formed by sequentially laminating, for example, an n-type first contact layer, a absorption layer, and a p-type second contact layer. Further, the optical semiconductor element is equipped with an electrode connected to the first mirror and an electrode connected to the second mirror of the surface-emitting type semiconductor laser, and an electrode connected to the first contact layer and an electrode connected to the second contact layer of the photodetecting element, wherein the electrode connected to the second mirror of the surface-emitting type semiconductor laser and the electrode connected to the first contact layer of the photodetecting element are electrically connected to each other.

When manufacturing optical semiconductor elements described in the aforementioned patent documents, it is noted that, unless a sufficient margin is secured in each of the manufacturing steps, the defect rate would become high and the manufacturing yield would lower, or optical semiconductor elements having high resistance that do not achieve the designed performance would be manufactured. For example, in the optical semiconductor element described in JP-A-2005-33106, the electrode connected to the second mirror of the surface-emitting type semiconductor laser and the electrode connected to the first contact layer of the photodetecting element are electrically connected to each other. These electrodes are formed with different materials in different steps. For this reason, when forming each of the electrodes, line disconnections may occur due to step differences formed unless a sufficient margin is secured in each mask for forming each of the electrodes.

Also, if metal composing each of the electrodes provided on the optical semiconductor element is oxidized, the bonding strength of each of the metal wires (bonding wires) to be connected to the electrodes may deteriorate, such that the metal wires would likely be detached, and the reliability of the element may lower. Furthermore, if the contact area of the electrode on the photodetecting element with respect to the first contact layer or the contact area with respect to the second contact layer is small, a problem occurs in that the resistance becomes higher and favorable characteristics (diode characteristics) would not be obtained.

SUMMARY

In accordance with an advantage of some aspects of the present invention, it is possible to provide optical semiconductor elements with high reliability and good performance, and a method for manufacturing optical semiconductor elements by which the optical semiconductor elements having the aforementioned property can be manufactured with high yield.

An optical semiconductor element in accordance with a first embodiment of the invention pertains to an optical semiconductor element equipped with a surface-emitting type semiconductor laser that emits laser light and a photodetecting element formed above the surface-emitting type semiconductor, the optical semiconductor element having a first electrode of a first polarity formed on the surface-emitting type semiconductor laser, a second electrode of a second polarity different from the first polarity formed on the photodetecting element, and an additional electrode that covers the first electrode and the second electrode.

In accordance with the first embodiment of the invention, the first electrode provided on the surface-emitting type semiconductor laser and the second electrode provided on the photodetecting element are covered by the additional electrode, such that oxidation of the electrodes can be prevented, and the bonding strength of metal wires (bonding wires) can be enhanced. As a result, the reliability of the optical semiconductor element can be improved.

Further, in the optical semiconductor element in accordance with an aspect of the first embodiment of the invention, the first electrode and the second electrode may be alternately formed along a circumferential direction around an emission surface of the laser light, and the additional electrode may be formed to surround the emission surface and to cover the first electrode and the second electrode.

In accordance with the embodiment of the invention described above, the first electrode and the second electrode are alternately formed in the circumferential direction around the emission surface, such that an electric filed is formed generally symmetrical about the laser light, and therefore a stable mode (transverse mode) of the laser light can be obtained.

Furthermore, the optical semiconductor element in accordance with an aspect of the first embodiment of the invention may preferably be equipped with a first columnar section including at least a portion of the surface-emitting type semiconductor laser and a portion of the photodetecting element, and a second columnar section that is formed above the first columnar section, has a cross-sectional area smaller than a cross-sectional area of the first columnar section, and includes the remaining portion of the photodetecting element.

In the optical semiconductor element in accordance with an aspect of the first embodiment of the invention, the photodetecting element may be equipped with a first semiconductor layer composed of a first conductivity type, a second semiconductor layer that functions as a absorption layer, and a third semiconductor layer composed of a second conductivity type, wherein the first semiconductor layer may be included in the first columnar section, and the second semiconductor layer and the third semiconductor layer may be included in the second columnar section.

In the optical semiconductor element in accordance with an aspect of the first embodiment of the invention, the second electrode may preferably be formed on the first semiconductor layer included in the first columnar section.

According to the embodiment described above, because the second electrode is formed on the first semiconductor layer included in the first columnar section, the first semiconductor layer and the second electrode can have a large bonding area, such that the resistance of the photodetecting element can be reduced. As a result, the photodetecting element can be provided with excellent characteristics.

Also, in the optical semiconductor element in accordance with an aspect of the first embodiment of the invention, the first semiconductor layer included in the first columnar section may preferably have an outer circumferential portion formed in a comb teeth shape around the laser light emission surface, wherein the first electrode may be formed in gaps of the comb teeth of the first semiconductor layer.

An optical semiconductor element in accordance with a second embodiment of the invention pertains to an optical semiconductor element equipped with a surface-emitting type semiconductor laser that emits laser light and a photodetecting element formed above the surface-emitting type semiconductor, the optical semiconductor element having a first columnar section that includes at least a portion of the surface-emitting type semiconductor laser and a portion of the photodetecting element, and a second columnar section that is formed on the first columnar section, has a cross-sectional area smaller than a cross-sectional area of the first columnar section, and includes the remaining portion of the photodetecting element.

In the optical semiconductor element in accordance with an aspect of the second embodiment of the invention, the photodetecting element may be equipped with a first semiconductor layer composed of a first conductivity type, a second semiconductor layer that functions as a absorption layer, and a third semiconductor layer composed of a second conductivity type, wherein the first semiconductor layer may be included in the first columnar section, and the second semiconductor layer and the third semiconductor layer may be included in the second columnar section.

In the optical semiconductor element in accordance with an aspect of the second embodiment of the invention, one of electrodes formed on the photodetecting element may be formed on the first semiconductor layer included in the first columnar section.

According to the aforementioned aspects of the embodiment of the invention, a portion of the photodetecting element and at least a portion of the surface-emitting type semiconductor laser are included in the first columnar section, wherein the portion of the photodetecting element included in the first columnar section may be, in a concrete example, a first semiconductor layer of the photodetecting element. For this reason, the first semiconductor layer can be formed with a cross-sectional area of the first columnar section; and when an electrode is formed on the first semiconductor layer, its bonding area can be made greater, and the resistance of the photodetecting element can be therefore reduced. As a result, the photodetecting element can be provided with excellent characteristics.

Also, in the optical semiconductor element in accordance with an aspect of the first and second embodiments of the invention, an isolation layer may preferably be formed between the surface-emitting type semiconductor laser and the photodetecting element for isolating the surface-emitting type semiconductor laser from the photodetecting element.

Moreover, in the optical semiconductor element in accordance with an aspect of the first and second embodiments of the invention, the isolation layer may preferably be included in the first columnar section.

DESCRIPTION OF EXEMPLARY EMBODIMENTS

Figure 1:
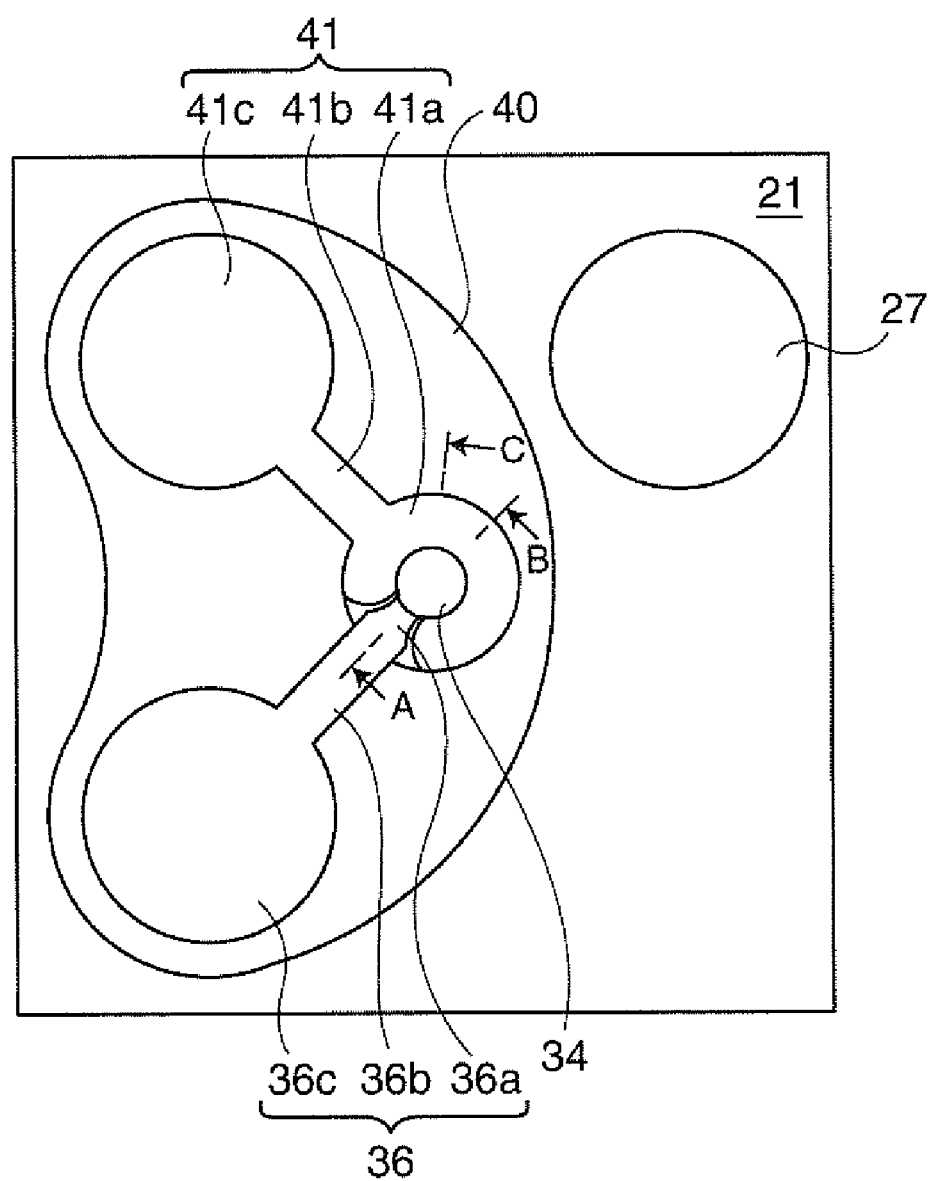
FIG. 1 is a schematic plan view of an optical semiconductor element in accordance with an embodiment of the invention.

An optical semiconductor element and its manufacturing method in accordance with an embodiment of the invention are described in detail with reference to the accompanying drawings. It is noted that the embodiment to be described below indicates a part of modes of the invention, does not limit the invention, and can be optionally modified within the scope of the invention. Also, in the drawings referred to below for describing the embodiment, the scale may be changed for each of the layers and each of the members such that the layers and the members can have appropriate sizes that can be recognized on the drawings.

Structure of Optical Semiconductor Element

Figure 2:
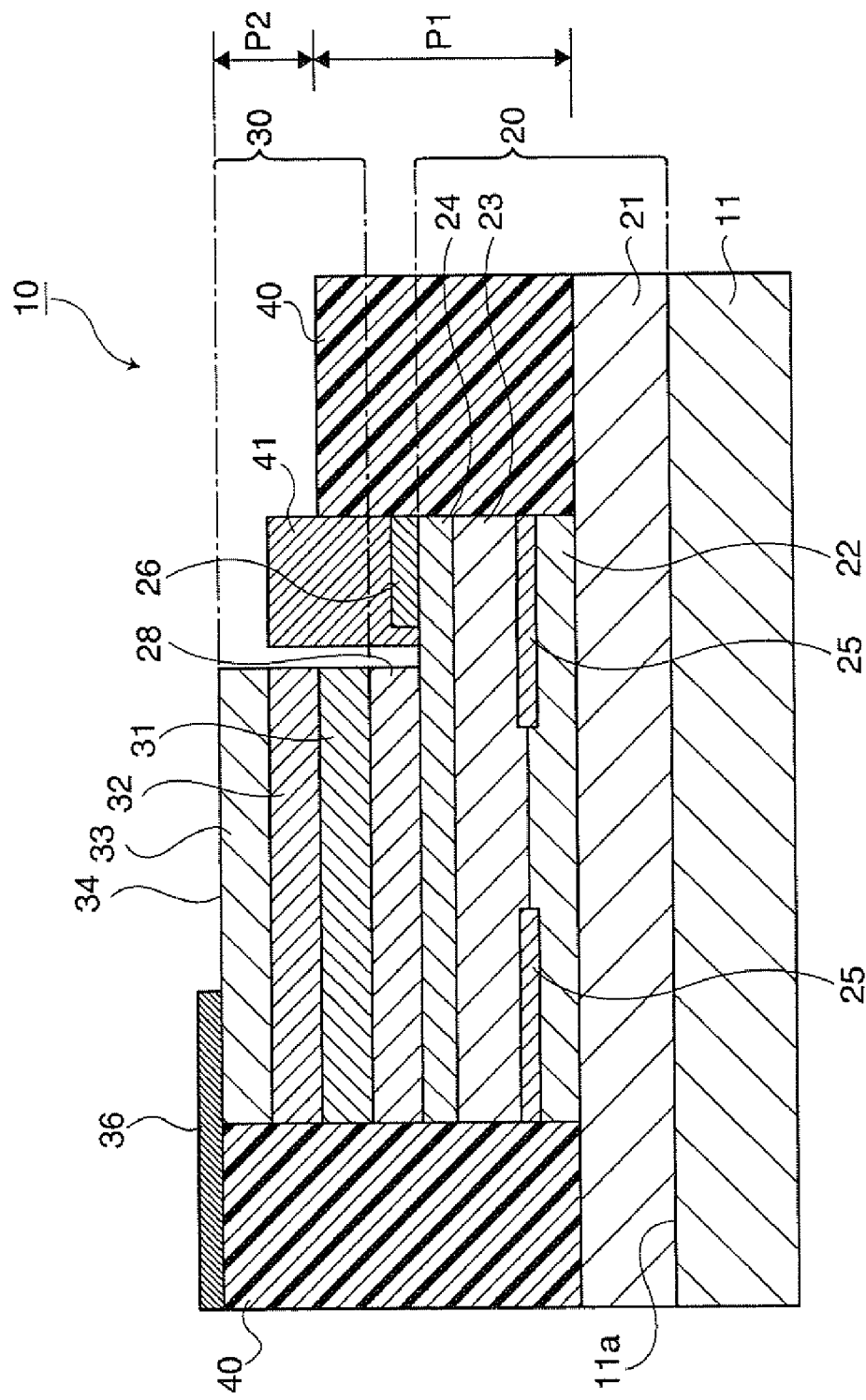
FIG. 2 is a cross-sectional view taken along a line A-B in FIG. 1.
Figure 3:
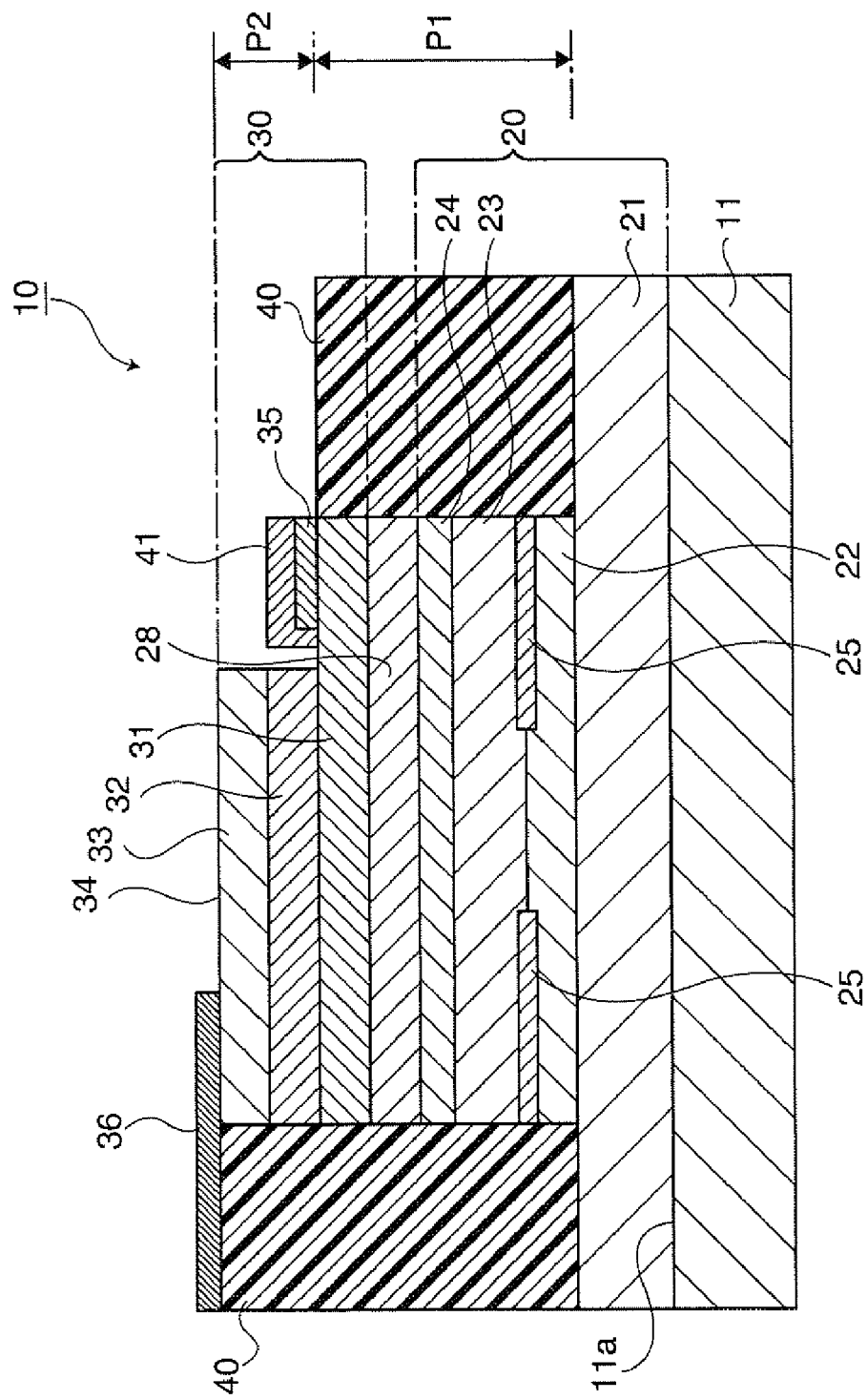
FIG. 3 is a cross-sectional view taken along a line A-C in FIG. 1.

FIG. 1 schematically shows a plan view of an optical semiconductor element in accordance with an embodiment of the invention, FIG. 2 is a cross-sectional view taken along a line A-B in FIG. 1, and FIG. 3 is a cross-sectional view taken along a line A-C in FIG. 1. As shown in FIGS. 2 and 3, the optical semiconductor element 10 of the present embodiment has a structure including a surface-emitting type semiconductor laser 20 and a photodetecting element 30. The structure of each of the elements and the entire structure thereof are described below.

Surface-Emitting Type Semiconductor Laser

The surface-emitting type semiconductor laser 20 is formed on a semiconductor substrate (e.g., an n-type GaAs substrate in the present embodiment) 11. The surface-emitting type semiconductor laser 20 includes a vertical resonator, and in accordance with the present embodiment, one of distributed Bragg reflector distributed Bragg reflector that form the vertical resonator is formed in a semiconductor deposited body (hereafter referred to as a first columnar section) P1. In other words, the surface-emitting type semiconductor laser 20 has a structure in which a part thereof is included in the first columnar section P1.

The surface-emitting type semiconductor laser 20 has a multilayer structure in which, for example, a distributed Bragg reflector of 40 pairs of alternately laminated n-type $Al_{0.9}Ga_{0.1}As$ layers and n-type $Al_{0.15}Ga_{0.85}As$ layers (hereafter called a "first mirror") 21, an active layer 22 composed of GaAs well layers and $Al_{0.3}Ga_{0.7}As$ barrier layers in which the well layers include a quantum well structure composed of three layers, and a distributed Bragg reflector of 25 pairs of alternately laminated p-type $Al_{0.9}Ga_{0.1}As$ layers and p-type $Al_{0.15}Ga_{0.85}As$ layers (hereafter called a "second mirror") 23, which are successively stacked in layers.

In the present embodiment, the Al composition of an AlGaAs layer is a composition of aluminum (Al) with respect to gallium (Ga). The Al composition in an AlGaAs layer ranges from 0 to 1. In other words, an AlGaAs layer includes a GaAs layer (when the Al composition is 0) and an AlAs layer (when the Al composition is 1). Also, the composition of each of the layers and the number of the layers forming the first mirror 21, the active layer 22, the second mirror 23 and a contact layer 24 are not particularly limited.

The first mirror 21 composing the surface-emitting type semiconductor laser 20 is formed to be n-type by, for example, doping silicon (Si), and the second mirror 23 is formed to be p-type by, for example, doping carbon (C). Accordingly, the p-type second mirror 23, the active layer 22 in which no impurity is doped, and the n-type first mirror 21 form a pin diode. Also, a portion among the surface-emitting type semiconductor laser 20 including the active layer 22, the second mirror 23 and the contact layer 24 is etched in a circular shape, as viewed from an upper surface of the contact layer 24, thereby forming a portion of the first columnar section P1. It is noted that, in the present embodiment, the first columnar section P1 has a plane configuration that is circular, but its configuration can have any arbitrary configuration.

Furthermore, a current constricting layer 25, which is obtained by oxidizing the AlGaAs layer from its side surface, is formed in a region near the active layer 22 among the layers composing the second mirror 23. The current constricting layer 25 is formed in a ring shape. In other words, the current constricting layer 25 has a cross section, when cut in a plane parallel with a surface 11a of the semiconductor substrate 11 shown in FIG. 2 and FIG. 3, which is in a circular ring shape concentric with a circular shape of the plane configuration of the first columnar section P1.

As shown in FIG. 2, an electrode 26 is provided on the contact layer 24 along an outer circumference of the first columnar section P1. In other words, referring to FIG. 2, a portion of the layers where the electrode 26 is formed is etched until the contact layer 24 is exposed, and the electrode 26 is formed on the exposed portion of the contact layer 24. In contrast, referring to FIG. 3, a portion of the layers where the electrode 26 is not formed is not etched down to the contact layer 24. It is noted that an isolation layer 28 and a first contact layer 31 of the photodetecting element 30 (to be described below) have an outer circumference portion that is formed in a comb teeth shape around an emission surface 34 for emitting laser light emitted from the surface-emitting type semiconductor laser 20, and the electrode 26 is formed between the comb teeth, which is described below in greater detail. Also, an additional electrode 41 is formed over the electrode 26 in a manner to cover the electrode 26. Details of the additional electrode 41 are described below.

The electrode 26 is composed of, for example, a laminated film of an alloy of chrome (Cr), gold (Au) and zinc (Zn), and gold (Au), or a laminated film of platinum (Pt), titanium (Ti) and gold (Au). Also, as shown in FIG. 1, an electrode 27 is formed on a portion of the second mirror 21. The electrode 27 is composed of, for example, a laminated film of an alloy of chrome (Cr), gold (Au) and germanium (Ge), nickel (Ni), and gold (Au). These electrodes 26 and 27 are used to drive the surface-emitting type semiconductor laser 20, and electric current is injected in the active layer 22 through the electrode 26 and the electrode 27.

Isolation Layer

In the optical semiconductor element 10 of the present embodiment, an isolation layer 28 is formed on the surface-emitting type semiconductor laser 20. In other words, the isolation layer 28 is provided between the surface-emitting type semiconductor laser 20 and a photodetector element 30 to be described below. Concretely, as shown in FIGS. 2 and 3, the isolation layer 28 is formed on the contact layer 24. In other words, the isolation layer 28 is provided between the contact layer 24 of the surface-emitting type semiconductor laser 20 and a first contact layer 31 (to be described below) of the photodetecting element 30 (to be described below).

The isolation layer 28 is included in the first columnar section P1, and has an outer circumference portion formed in a comb teeth shape around the emission surface 34 of laser light emitted from the surface-emitting type semiconductor laser 20. It is noted that the first contact layer 31 of the photodetecting element 30 also has an outer circumference portion formed in a comb teeth shape around the laser light emission surface 34, like the isolation layer 28. As shown in FIG. 2, the isolation layer 28 and the first contact layer 31 are formed to have a diameter including their comb teeth equal to the diameter of the first columnar section P1. The isolation layer 28 shall be described in greater detail in conjunction with a method for manufacturing an optical semiconductor element to be described below.

Photodetecting Element

The photodetecting element 30 is provided on the isolation layer 28, and on an optical path of laser light coming from the surface-emitting type semiconductor laser 20. The photodetecting element 30 includes a first contact layer 31, a absorption layer 32, and a second contact layer 33. The first contact layer 31 is provided on the isolation layer 28, the absorption layer 32 is provided on the first contact layer 31, and the second contact layer 33 is provided on the absorption layer 32. The plane configuration of the absorption layer 32 and the second contact layer 33 is made to be smaller than the plane configuration of the first contact layer 31. The second contact layer 33 and the absorption layer 32 compose a columnar semiconductor deposited body (hereafter referred to as a second columnar section) P2. The cross-sectional area of the second columnar section P2 is formed to be smaller than the cross-sectional area of the first columnar section P1. For example, a columnar section P21 of the second columnar section P2 (see FIG. 4) is formed to have a diameter smaller than the diameter of the first columnar section P1 by about 5 μm. The photodetecting element 30 has a portion included in the first columnar section P1, and the remaining portion included in the second columnar section P2. It is noted that a top surface of the photodetecting element 30 defines the emission surface 34 of laser light emitted from the surface-emitting type semiconductor laser 20.

The first contact layer 31 forming the photodetecting element 30 may be composed of, for example, an n-type GaAs layer, the absorption layer 32 may be composed of, for example, a GaAs layer in which no impurity is introduced, and the second contact layer 33 may be composed of, for example, a p-type GaAs layer. More specifically, the first contact layer 31 is made to be n-type by doping, for example, silicon (Si), and the second contact layer 33 is made to be p-type by doping, for example, carbon (C). Accordingly, the n-type first contact layer 31, the absorption layer 32 in which no impurity is doped, and the p-type second contact layer 33 form a pin diode.

As shown in FIG. 3, an electrode 35 is formed on the first contact layer 31 of the photodetecting element 30 partially along the outer circumference of the first columnar section P1. In other words, referring to FIG. 3, a portion of the layers where the electrode 35 is to be formed is etched until the first contact layer 31 is exposed, and the electrode 35 is formed on the exposed portion of the first contact layer 31. In contrast, referring to FIG. 2, in a portion where the electrode 35 is not formed, the layers are etched to the contact layer 24 of the surface-emitting type semiconductor laser 20 and an electrode 26 is formed. It is noted that the electrode 35 is formed on the comb teeth of the first contact layer 31 formed in a comb teeth shape, which is described in detail below. Further, an additional electrode 41 is formed above the electrode 35 in a manner to cover the electrode 35. Details of the additional electrode 41 shall be described below in detail.

The electrode 35 may be formed with the same material as that of the electrode 27 that is formed on the first mirror 21 of the surface-emitting type semiconductor laser 20. In other words, for example, a laminated film of an alloy of chrome (Cr), gold (Au) and germanium (Ge), nickel (Ni), and gold (Au) can be used.

Furthermore, an electrode 36 is formed on a top surface of the photodetecting element 30 (on a second contact layer 33). As shown in FIG. 1, the electrode 36 has a connection section 36a having a wedge shaped plane configuration, a wiring section 36b having a rectangular plane configuration, and a pad section 36c having a circular plane configuration. The electrode 36 is bonded and electrically connected to the top surface (the second contact layer 33) of the photodetecting element 30 at the connection section 36a. The wiring section 36b of the electrode 36 connects to the connection section 36a and the pad section 36c. The pad section 36c of the electrode 36 is used as an electrode pad.

The electrode 36 may be formed with the same material as that of the electrode 26 that is formed on the contact layer 24 of the surface-emitting type semiconductor laser 20. In other words, the electrode 36 may be formed with, for example, a laminated film of an alloy of chrome (Cr), gold (Au) and zinc (Zn), and gold (Au), or a laminated film of platinum (Pt), titanium (Ti) and gold (Au).

Insulation Layer

The optical semiconductor element 10 in accordance with the present embodiment includes an insulation layer 40 formed on the first mirror 21 in a manner to surround mainly the first columnar section P1, as shown in FIG. 1 through FIG. 3. Also, a portion of the side surface of the second columnar section P2 (on the side where the electrode 36 is formed) is also covered by the insulation layer 40.

Additional Electrode

The additional electrode 41 is provided to electrically connect the electrode 26 of the surface-emitting type semiconductor laser 20 with the electrode 35 of the photodetecting element 30, and to prevent oxidation of the electrodes 26 and 35. It is noted that, in FIGS. 2 and 3 (FIG. 3 in particular), the thickness of the additional electrode 41 illustrated is exaggerated. As shown in FIG. 1, the additional electrode 41 has a connection section 41a having a ring shaped plane configuration, a wiring section 41b, and a pad section 41c having a circular plane configuration. The additional electrode 41 is formed on the top surface of the electrodes 26 and 35 at the connection section 41a and electrically connected to the electrodes 26 and 35. It is noted that the electrode 26 of the surface-emitting type semiconductor laser 20 may also be formed below the wiring section 41b and the pad section 41c of the additional electrode 41, such that the additional electrode 41 and the electrode 26 may also be connected at the wiring section 41b and the pad section 41c. The wiring section 41b of the additional electrode 41 connects to the connection section 41a and the pad section 41c. The pad section 41c of the additional electrode 41 is used as an electrode pad.

The additional electrode 41 may be formed from, for example, a laminated film of chrome (Cr) and gold (Au). It is noted that, in the present embodiment, the case where the additional electrode 41 is provided only on the top surface of the electrodes 26 and 35, as shown in FIG. 1, is described as an example. However, an additional electrode similar to the additional electrode 41 may also be formed on the electrode 27 and the electrode 36 to prevent oxidation of these electrodes.

Figure 4A:
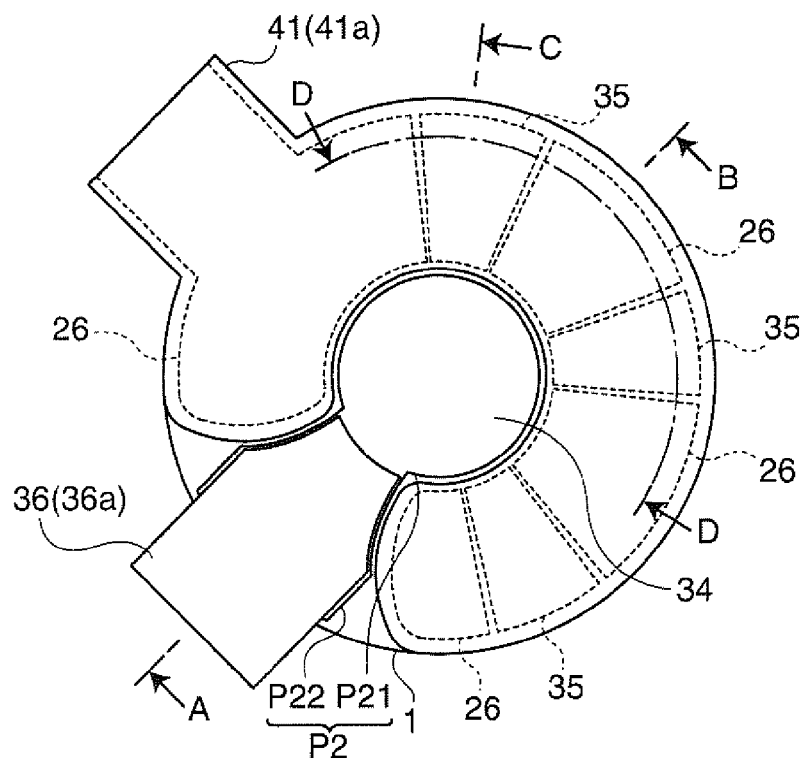
FIG. 4A is an enlarged plan see-through view of an area around an emission surface 34 for emitting laser light.
Figure 4B:
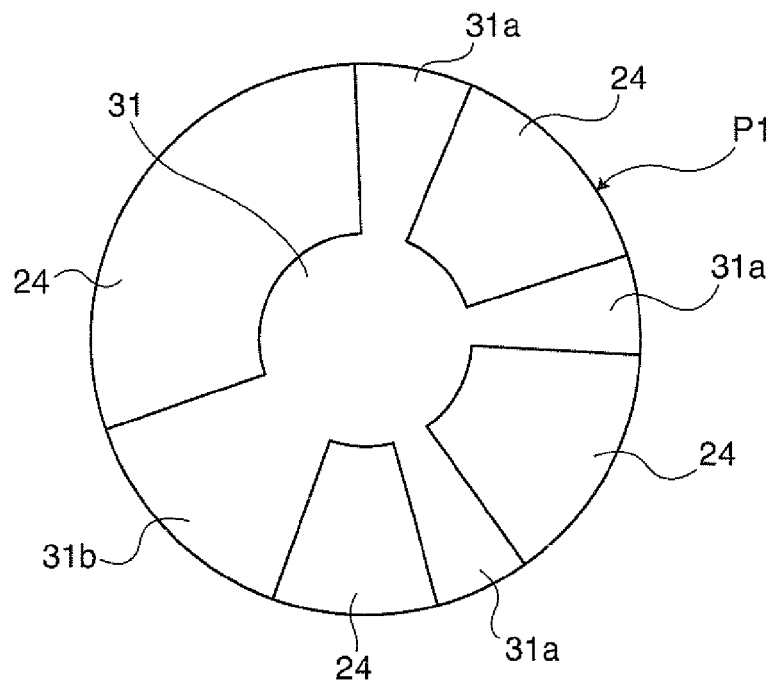
FIG. 4B is a plan view of a first contact layer 31 and an isolation layer 28.

Next, the electrode 26 of the surface-emitting type semiconductor laser 20, the electrode 35 of the photodetecting element 30 and the additional electrode 41 are described in detail FIGS. 4A and 4B. FIGS. 4A and 4B are enlarged see-through plan views of an area around the emission surface 34 from which laser light is emitted. As shown in FIG. 4A, the second columnar section P2 is formed on the first columnar section P1 having a circular plane configuration. The second columnar section P2 is composed of a columnar section P21 formed concentric with the first columnar section P1, and a protruded section P22 protruded from the side surface of the columnar section P21 in a direction in which the wiring section 36b of the electrode 36 extends. The top surface of the columnar section P21 defines a laser light emission surface 34, and the connection section 36a of the electrode 36 is bonded to the top surface of the protruded section P22.

As shown in FIG. 4A, the electrode 26 and the electrode 35 are alternately formed around the laser light emission surface 34, traversing the emission surface 34, except a portion where the connection section 36a of the electrode 36 is bonded. It is noted here that the electrode 26 is an electrode that is connected to the contact layer 24 of the surface-emitting type semiconductor laser 20, and the electrode 35 is an electrode that is connected to the first contact layer 31 of the photodetecting element 30. In order to form these electrodes in a plane arrangement shown in FIG. 4A, and to connect these electrodes to the contact layer 24 or the first contact layer 31, an outer circumferential portion of the first contact layer 31 of the photodetecting element 30 and the isolation layer 28 is formed in a comb teeth shape, as shown in FIG. 4B.

Comb teeth 31a in the outer circumferential portion of the first contact layer 31 are formed in positions where the electrode 35 is to be formed. Also, the contact layer 24 of the surface-emitting type semiconductor laser 20 is exposed between the comb teeth 31a. The electrode 35 is formed in a manner to cover the upper portion and side surface of the comb teeth 31a, and the electrode 26 is formed on the contact layer 24 of the surface-emitting type semiconductor laser 20 exposed through the comb teeth 31a. The second columnar section P2 shown in FIG. 4A is formed above the comb teeth 31b of the first contact layer 31 shown in FIG. 4B. It is noted that the isolation layer 28 that is formed below the first contact layer 31 is also formed in the same plane configuration as that of the first contact layer 31.

Figure 5:
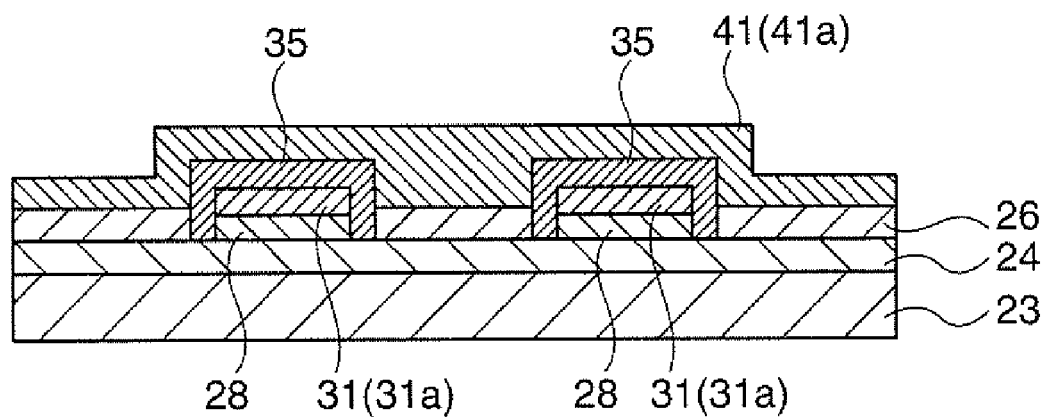
FIG. 5 is a cross-sectional view taken along a line D-D of FIG. 4A.

FIG. 5 is a cross-sectional view taken along a line D-D in FIG. 4A. As shown in FIG. 5, the isolation layer 28 and the first contact layer 31 (the comb teeth 31a) are formed partially along the circumference of the optical path of the laser light. The electrode 35 is formed on the first contact layer 31 in a manner to cover the comb teeth 31a. Also, the electrode 26 is formed on the contact layer 24 of the surface-emitting type element 20 in a region other than the region that is covered by the electrode 35. It is noted that, as shown in FIG. 5, the electrode 26 and the electrode 35 are formed in contact with each other. Also, the additional electrode 41 (the connection section 41a) is formed in a manner to cover the electrode 26 and the electrode 35. By providing the additional electrode 41, oxidation of the electrode 26 and the electrode 35 can be prevented, and contact failure between the electrode 26 and the electrode 35 can be prevented. Also, the electrode 26 and the electrode 35 are alternately formed along the circumference of the optical path of laser light, such that an electric field is formed generally symmetrical with respect to the laser light, and therefore a stable mode (transverse mode) of the laser light can be obtained.

Overall Structure

In the optical semiconductor element 10 in accordance with the present embodiment, the n-type first mirror 21 and the p-type second mirror 23 of the surface-emitting type semiconductor laser 20, and the n-type first contact layer 31 and the p-type second contact layer 33 of the photodetecting element 30 form a npnp structure as a whole. The photodetecting element 30 is provided to monitor outputs of laser light generated by the surface-emitting type semiconductor laser 20. Concretely, the photodetecting element 30 converts laser light generated by the surface-emitting type semiconductor laser 20 into electric current. With values of the electric current, outputs of laser light generated by the surface-emitting type semiconductor laser 20 are monitored.

More specifically, in the photodetecting element 30, a part of laser light generated by the surface-emitting type semiconductor laser 20 is absorbed by the absorption layer 32, and photoexcitation is caused by the absorbed light in the absorption layer 32, and electrons and holes are generated. Then, by an electric field that is applied from an outside element, the electrons move to the electrode 35 and the holes move to the electrode 36, respectively. As a result, an electrical current is generated in the direction from the first contact layer 31 to the second contact layer 33 in the photodetecting element 30.

Also, light output of the surface-emitting type semiconductor laser 20 is determined mainly by a bias voltage applied to the surface-emitting type semiconductor laser 20. In particular, light output of the surface-emitting type semiconductor laser 20 greatly changes depending on the ambient temperature of the surface-emitting type semiconductor laser 20 and the lifetime of the surface-emitting type semiconductor laser 20. For this reason, it is necessary for the surface-emitting type semiconductor laser 20 to maintain a predetermined level of light output.

In the optical semiconductor element 10 in accordance with the present embodiment, light output of the surface-emitting type semiconductor laser 20 is monitored by the photodetecting element 30, and the value of a current flowing within the surface-emitting type semiconductor laser 20 can be adjusted based on the value of the electrical current generated by the photodetecting element 30. Accordingly, a predetermined level of light output can be maintained in the surface-emitting type semiconductor laser 20. The control to feed back the light output of the surface-emitting type semiconductor laser 20 to the value of a voltage to be applied to the surface-emitting type semiconductor laser 20 can be performed by using an external electronic circuit (e.g., a drive circuit not shown).

Figure 6:
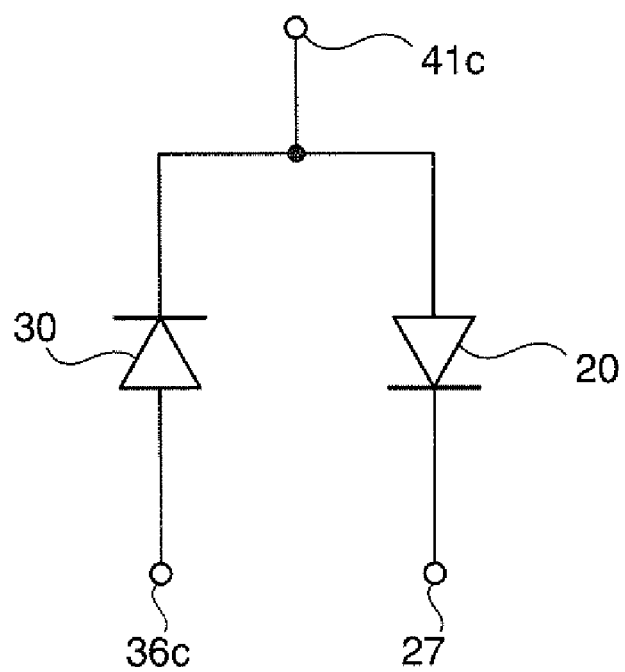
FIG. 6 is an equivalent electrical circuit diagram of an optical semiconductor element 10 in accordance with an embodiment of the invention.

FIG. 6 is an electrical equivalent circuit diagram of the optical semiconductor element 10 in accordance with an embodiment of the invention. As shown in FIG. 6, the photodetecting element 30 has an anode electrode (positive electrode) connected to the pad section 36c of the electrode 36, and a cathode electrode (negative electrode) connected to the pad section 41c of the additional electrode 41. Also, the surface-emitting type semiconductor laser 20 has an anode electrode (positive electrode) connected to the pad section 41c of the additional electrode 41, and a cathode electrode (negative electrode) connected to the electrode 27.

Operation of Optical Semiconductor Element

General operations of the optical semiconductor element 10 of the present embodiment are described below. It is noted that the following method for driving the optical semiconductor element 10 is described as an example, and various changes can be made within the scope of the invention. First, when the pad section 41c and the electrode 27 are connected to a power supply (not shown), and a current in a forward direction is applied between the electrode 26 and the electrode 27, recombination of electrons and holes occur in the active layer 22 of the surface-emitting type semiconductor laser 20, thereby causing emission of light due to the recombination. Stimulated emission occurs during the period the generated light reciprocates between the second mirror 23 and the first mirror 21, whereby the light intensity is amplified. When the optical gain exceeds the optical loss, laser oscillation occurs, whereby laser light is emitted from the upper surface of the second mirror 23, and enters the isolation layer 28. Then, the laser light enters the first contact layer 31 of the photodetecting element 30.

Then, in the photodetecting element 30, the light entered the first contact layer 31 then enters the absorption layer 32. As a result of a part of the incident light being absorbed by the absorption layer 32, photoexcitation is caused in the absorption layer 32, and electrons and holes are generated. Then, by an electric field applied from an outside element, the electrons move to the electrode 35 and the holes move to the electrode 36, respectively. As a result, an electrical current (photoelectric current) is generated in the direction from the first contact layer 31 to the second contact layer 33 in the photodetector element 30. By taking out the current from the pad sections 36c, 41c, and measuring the value of the current, light output of the surface-emitting type semiconductor laser 20 can be detected.

Method for Manufacturing Optical Element

Figure 7A:
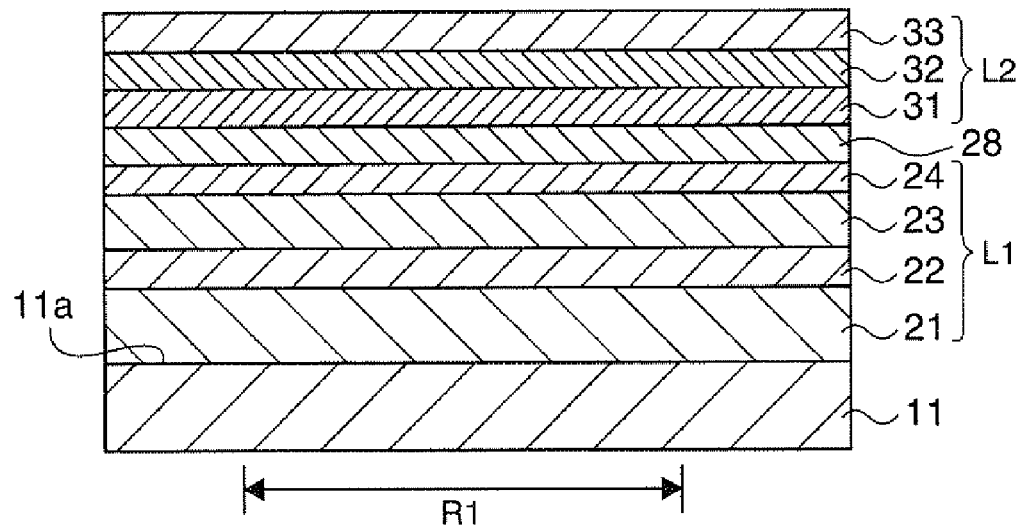
FIGS. 7A and 7B are cross-sectional views schematically showing steps of a method for manufacturing an optical semiconductor element in accordance with an embodiment of the invention.

Next, one example of a method for manufacturing the optical semiconductor element 10 described above is described. FIGS. 7-11 are cross-sectional views schematically showing a process of manufacturing an optical semiconductor element in accordance with an embodiment of the invention. It is noted that these drawings correspond to the cross-sectional view shown in FIG. 3, respectively. Also, a region R1 shown in FIGS. 7-9, and FIG. 10A indicates a region where a first columnar section P1 is to be formed. To manufacture the optical semiconductor element 10 of the present embodiment, first, on a surface 11a of a semiconductor substrate 11 composed of an n-type GaAs layer, a semiconductor multilayer film is formed by epitaxial growth while modifying its composition, as shown in FIG. 7A.

It is noted here that the semiconductor multilayer film is formed from a first semiconductor multilayer film L1, an isolation layer 28 on the first semiconductor multilayer film L1, and a second semiconductor multilayer film L2 on the isolation layer 28. The first semiconductor multilayer film L1 is composed of, for example, a first mirror 21 of 40 pairs of alternately laminated n-type $Al_{0.9}Ga_{0.1}As$ layers and n-type $Al_{0.15}Ga_{0.85}As$ layers, an active layer 22 composed of GaAs well layers and $Al_{0.3}Ga_{0.7}As$ barrier layers in which the well layers include a quantum well structure composed of three layers, a second mirror 23 of 25 pairs of alternately laminated p-type $Al_{0.9}Ga_{0.1}As$ layers and p-type $Al_{0.15}Ga_{0.85}As$ layers, and a contact layer 24 composed of p-type GaAs.

The isolation layer 28 is composed of an AlGaAs layer in which no impurity is doped. Further, the second semiconductor multilayer film L2 is composed of a first contact layer 31 composed of an n-type GaAs layer, a absorption layer 32 composed of a GaAs layer in which no impurity is doped, and a second contact layer 33 composed of a p-type GaAs layer. These layers are sequentially laminated on the semiconductor substrate 11, thereby forming the semiconductor multilayer film. It is noted that the isolation layer 28 can be composed of a p-type or n-type AlGaAs layer.

It is noted that, when the second mirror 23 is grown, at least one layer thereof near the active layer 22 is formed to be a layer that is later oxidized and becomes a current constricting layer 25 (see FIG. 10B). More concretely, the layer that becomes to be the current constricting layer 25 is formed to be an AlGaAs layer (including an AlAs layer) having an Al composition that is greater than an Al composition of the isolation layer 28. In other words, the isolation layer 28 can be formed to be an AlGaAs layer whose Al composition is smaller than that of the layer that becomes to be the current constricting layer 25. By this, in an oxidizing process (see FIG. 10B) for forming the current constricting layer 25 to be described below, the isolation layer 28 is not oxidized. More specifically, the layer that becomes to be the current constricting layer 25 and the isolation layer 28 may preferably be formed such that the Al composition of the layer that becomes to be the current constricting layer 25 is 0.95 or greater, and the Al composition of the isolation layer 28 is less than 0.95. An optical film thickness of the isolation layer 28 may preferably be, for example, an odd multiple of $\lambda/4$, where $\lambda$ is a design wavelength of the surface-emitting type semiconductor laser 20 (see FIG. 2).

Also, the sum of optical film thickness of the first contact layer 31, the absorption layer 32 and the second contact layer 33, in other words, the optical film thickness of the entire photodetecting element 30 (see FIG. 2 and FIG. 3), may preferably be, for example, an odd multiple of $\lambda/4$. As a result of providing such a film thickness, the entire photodetecting element 30 can function as a distributed Bragg reflector. In other words, the entire photodetecting element 30 can function as a distributed Bragg reflector above the active layer 22 in the surface-emitting type semiconductor laser 20. Accordingly, the photodetecting element 30 can function as a distributed Bragg reflector without adversely affecting the characteristics of the surface-emitting type semiconductor laser 20.

The temperature at which the epitaxial growth is conducted is appropriately decided depending on the growth method, the kind of raw material, the type of the semiconductor substrate 11, and the kind, thickness and carrier density of the semiconductor multilayer film to be formed, and may preferably be set, in general, at 450° C.-800° C. Also, the time required for conducting the epitaxial growth is appropriately decided like the temperature. Also, a metal-organic vapor phase deposition (MOVPE: Metal-Organic Vapor Phase Epitaxy) method, a MBE method (Molecular Beam Epitaxy) method or a LPE (Liquid Phase Epitaxy) method can be used as a method for the epitaxial growth.

Figure 7B:
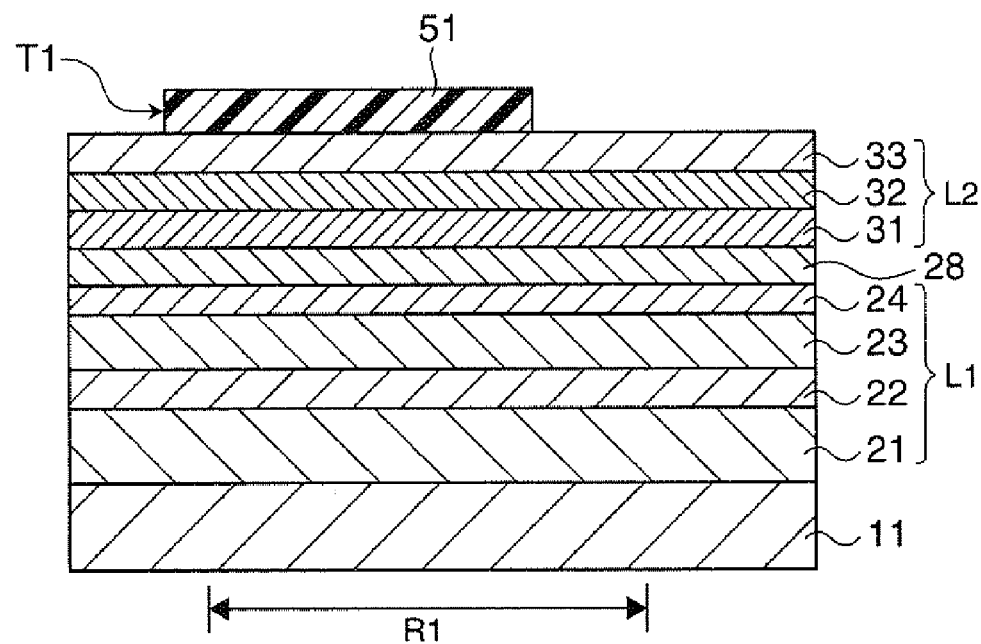
Figure 8A:
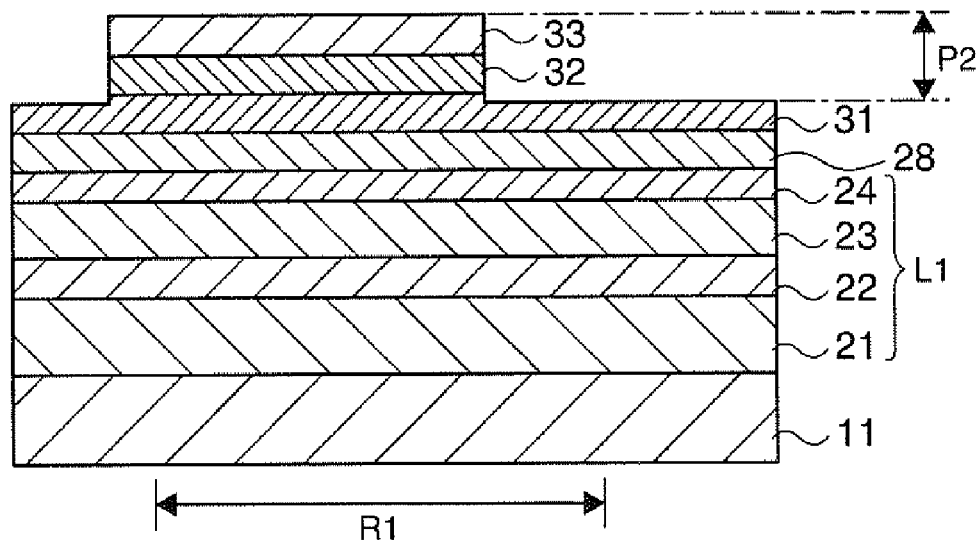
FIGS. 8A and 8B are cross-sectional views schematically showing steps of the method for manufacturing an optical semiconductor element in accordance with the embodiment of the invention.

Next, as shown in FIG. 7B, a second columnar section P2 is formed on the second semiconductor multilayer film L2. Concretely, first, resist is coated on the second semiconductor multilayer film L2, and then the resist is patterned by a lithography method. As a result, a resist layer 51 having a specified plane configuration is formed on the upper surface of the second contact layer 33. At this time, the resist layer 51 is formed in a manner that a portion of the resist layer 51 (a portion indicated by a sign T1) is disposed in an area outside the region R1 where the first columnar section P1 is to be formed. Then, by using the resist layer 51 as a mask, the second contact layer 33, the absorption layer 32 and a portion of the first contact layer 31 are etched by, for example, a dry etching method. Then, the resist layer 51 is removed. As a result, the second columnar section P2 having the same plane configuration as that of the resist layer 51 is formed, as shown in FIG. 8A.

Figure 8B:
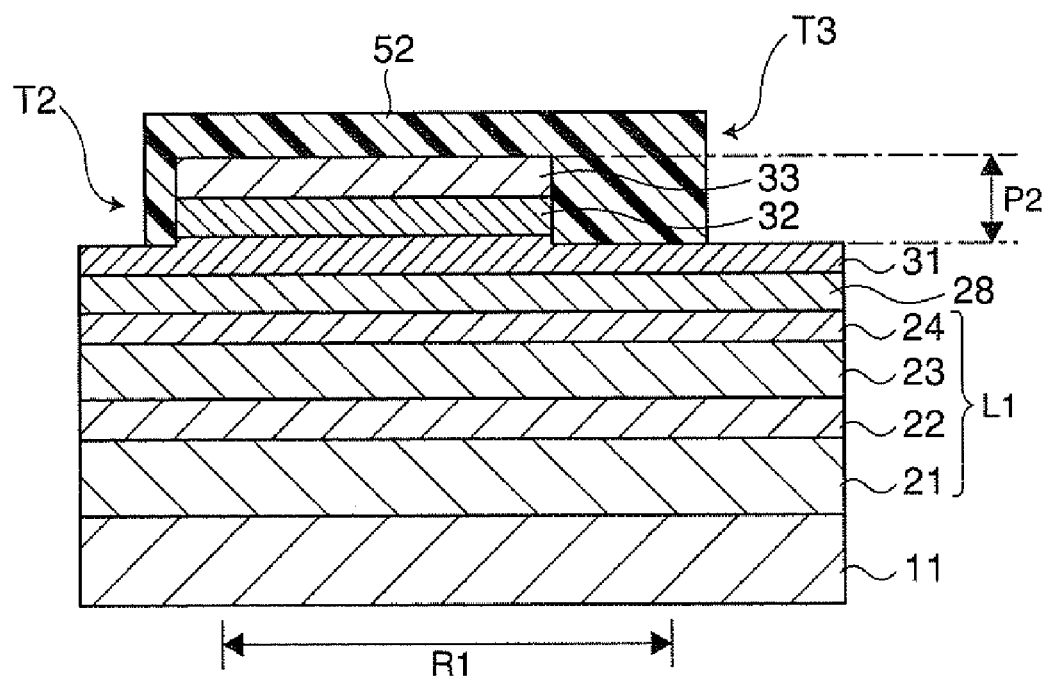

When the second columnar section P2 is formed, as shown in FIG. 8B, a resist layer 52 is formed on the first contact layer 31 to cover the second columnar section P2. More concretely, first, resist is coated on the first contact layer 31, and then the resist is patterned by a lithography method. As a result, a resist layer 52 having a specified pattern is formed on the top surface of the first contact layer 31. At this time, the resist layer 52 is formed in a manner that edge sections of the resist 52 (portions indicated by signs T2 and T3) are disposed in areas outside the region R1 where the first columnar section P1 is to be formed.

Then, by using the resist layer 52 as a mask, the first contact layer 31 is etched by a wet etching method. It is noted here that, for etching the first contact layer 31, for example, a mixed solution of ammonia, hydrogen peroxide and water can be used as the etchant. For example, the mixing ratio of ammonia, hydrogen peroxide and water that is about 1:10:150 can be used, but this mixing ratio is not particularly limited, and can be appropriately decided. Because the isolation layer 28 is disposed below the first contact layer 31, and the isolation layer 28 functions as an etching stopper layer, etching of the first contact layer 31 can be accurately and readily stopped at the time when the isolation layer 28 is exposed.

Figure 9A:
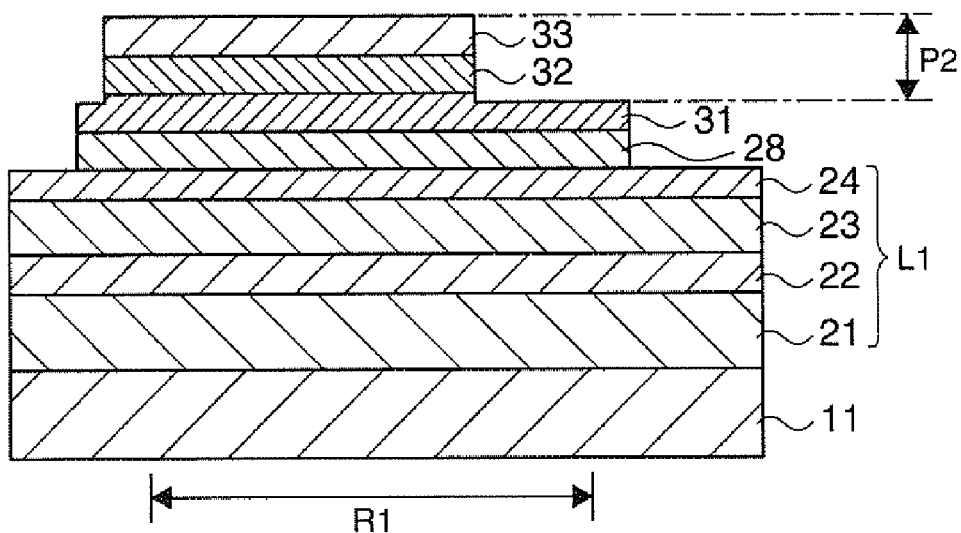
FIGS. 9A and 9B are cross-sectional views schematically showing steps of the method for manufacturing an optical semiconductor element in accordance with the embodiment of the invention.

When the etching of the first contact layer 31 is finished, the isolation layer 28 is etched by a wet etching method, using the resist layer 52 as a mask. As an etchant that may be used for etching the isolation layer 28, for example, hydrogen fluoride solution or hydrofluoric acid buffer solution can be used. Because the contact layer 24 is disposed below the isolation layer 28, and the contact layer 24 functions as an etching stopper layer, the etching of the isolation layer 28 can be accurately and readily stopped at the time when the contact layer 24 is exposed. Then, as the resist layer 52 is removed, the first contact layer 31 and the isolation layer 28 are formed in the same plane configuration as that of the resist layer 52, as shown in FIG. 9A. It is noted that the first contact layer 31 and the isolation layer 28 are etched to have an outer circumferential portion in a comb teeth in this step.

Figure 9B:
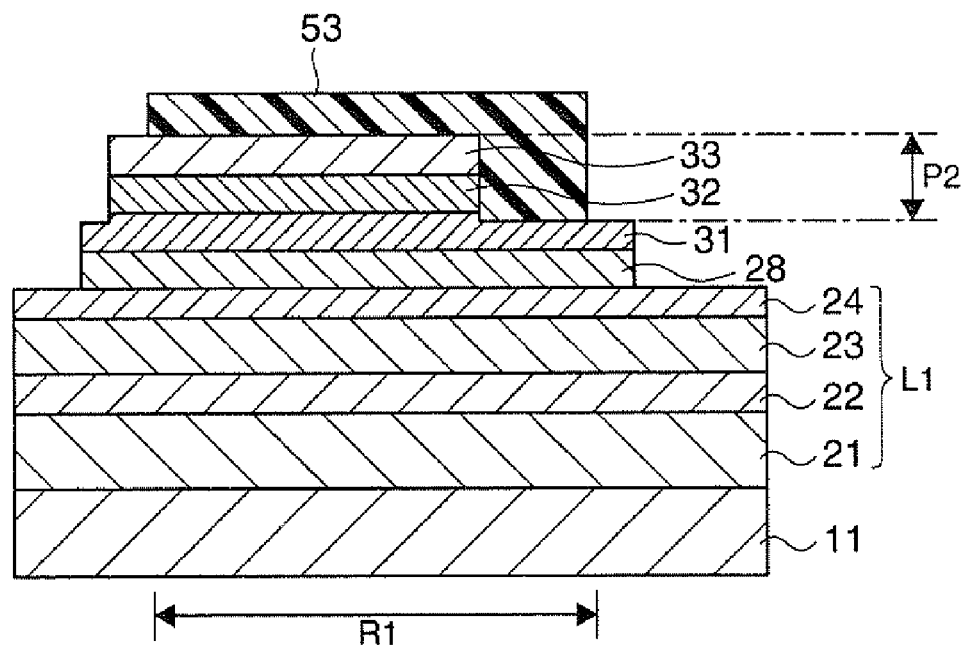

When the first contact layer 31 and the isolation layer 28 are etched, a resist layer 53 for forming a first columnar section P1 is formed on the first contact layer 31 and the second contact layer 33, as shown in FIG. 9B. The resist layer 53 is formed on the first contact layer 31 and the second contact layer 33 in a manner to cover only the inner area of the region R1 where the first columnar section P1 is to be formed. For this reason, there are portions of the first contact layer 31 and the second contact layer 33 which are not covered by the resist layer 53 and therefore exposed.

The resist layer 53 may be formed in the following manner. For example, resist is coated on the first contact layer 31 and the second contact layer 33, and the resist is patterned by a lithography method. By this, the resist layer 53 having a circular plane configuration is formed on the upper surface of the first contact layer 31 and the second contact layer 33. Then, by using the resist layer 53 as a mask, the second contact layer 33, the absorption layer 32, the first contact layer 31, the isolation layer 28, and the first semiconductor multilayer film L1 (the contact layer 24, the second mirror 23 and the active layer 22) are etched. Then, as the resist layer 53 is removed, the first columnar section P1 is formed, as shown in FIG. 10A.

Figure 10A:
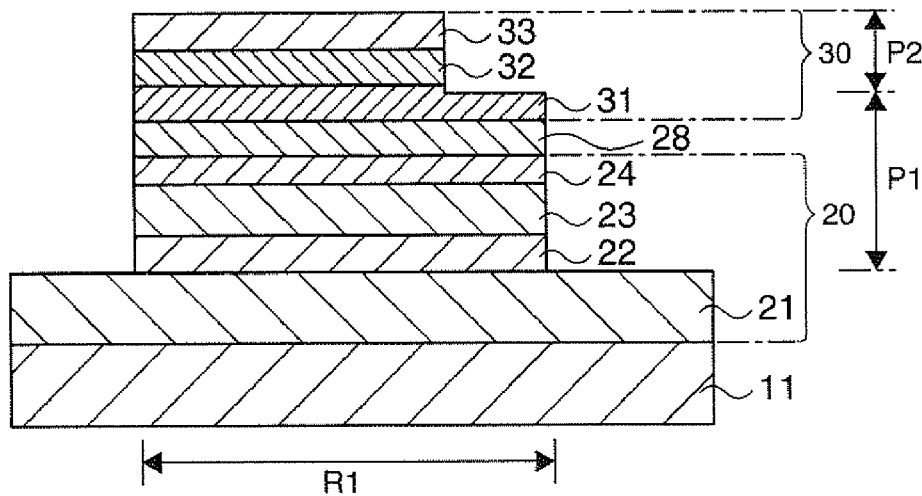
FIGS. 10A and 10B are cross-sectional views schematically showing steps of the method for manufacturing an optical semiconductor element in accordance with the embodiment of the invention.

By the steps described above, the photodetecting element 30 with the absorption layer 32 and the second contact layer 33 included in the second columnar section P2, and the first contact layer 31 included in the first columnar section P1 is formed, as shown in FIG. 10A. Also, together with the photodetecting element 30, the surface-emitting type semiconductor laser 20 with the active layer 22, the second mirror 23 and the contact layer 24 included in the first columnar section P1 is formed.

It is noted that, as shown in FIG. 8A, the second contact layer 33 and a portion of the absorption layer 32 are formed outside the region R1 where the first columnar section P1 is to be formed; also, as shown in FIG. 9A, the first contact layer 31 and a portion of the isolation layer 28 are formed outside the region R1 where the first columnar section P1 is to be formed; and then, as shown in FIG. 10A, the second contact layer 33, the absorption layer 32, the first contact layer 31 and the isolation layer 28 are etched in the size of the region R1 where the first columnar section P1 is to be formed. For this reason, the exposed area of the first contact layer 31 can be made greater without reducing the size (diameter) of the second columnar section P2. By this, the bonding area of the electrode 35 (see FIG. 3) formed on the first contact layer 31 can be made greater.

Figure 10B:
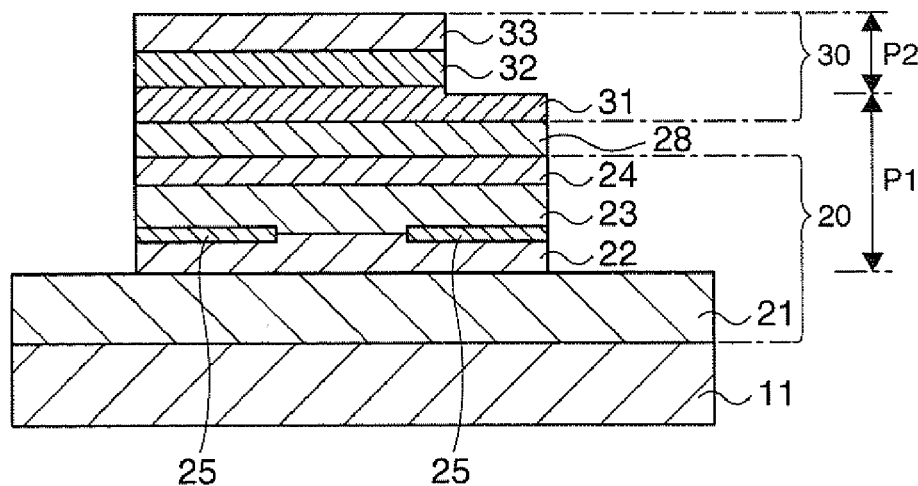

Next, a current constricting layer 25 is formed, as shown in FIG. 10B. To form the current constricting layer 25, the semiconductor substrate 11 on which the first columnar section P1 and the second columnar section P2 are formed through the aforementioned steps is placed in a water vapor atmosphere at, for example, about 400° C. As a result, a layer having a high Al composition provided in the second mirror 23 described above is oxidized from its side surface, whereby the current constricting layer 25 is formed.

The oxidation rate depends on the temperature of the furnace, the amount of water vapor supply, and the Al composition and the film thickness of the layer to be oxidized. In a surface-emitting type laser equipped with the current constricting layer 25 that is formed by oxidation, current flows only in a portion where the current constricting layer 25 is not formed (a portion that is not oxidized). Accordingly, in the process of forming the current constricting layer 25, the range of the current constricting layer 25 to be formed may be controlled, whereby the current density can be controlled. Also, the diameter of the current constricting layer 25 may preferably be adjusted such that a major portion of laser light that is emitted from the surface-emitting type semiconductor laser 20 enters the first contact layer 31.

Figure 11A:
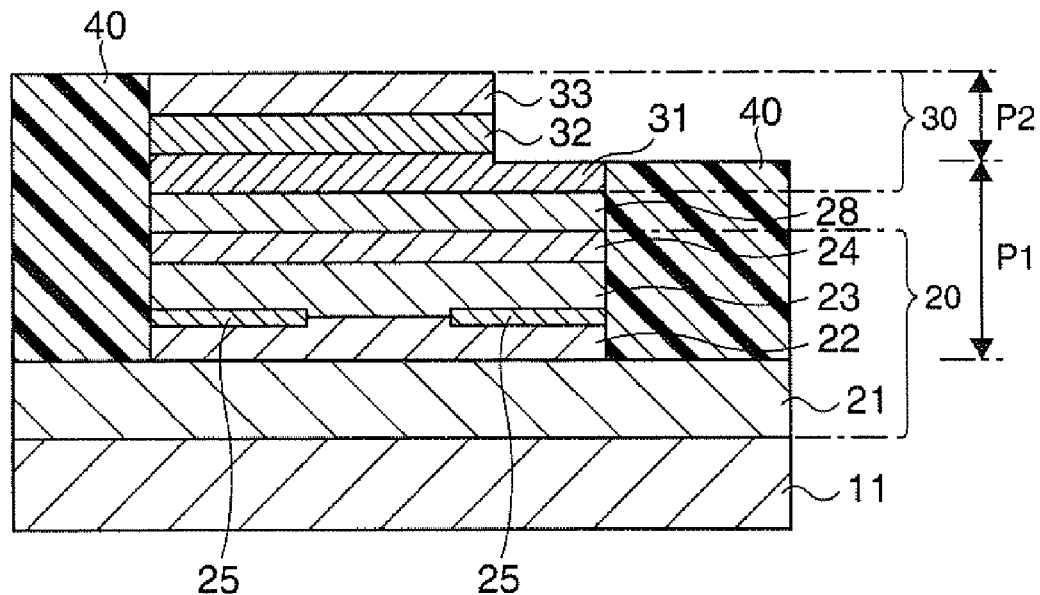
FIGS. 11A and 11B are cross-sectional views schematically showing steps of the method for manufacturing an optical semiconductor element in accordance with the embodiment of the invention.

Next, as shown in FIG. 11A, an insulation layer 40 is formed on the first mirror 21, around the first columnar section P1, and in a manner to cover a portion of the side surface of the second columnar section P2. The insulation layer 40 may preferably be composed of a material that is easier to make a thick film. The film thickness of the insulation layer 40 may be, for example, about 2-4 μm, without any particularly limitation, and may be appropriately set according to the height of the first columnar section P1 and the second columnar section P2.

For example, the insulation layer 40 can be formed from a layer that is obtained by hardening liquid material settable by energy, such as, heat, light or the like (for example, a precursor of ultraviolet setting type resin or thermosetting type resin). As the ultraviolet setting type resin, for example, an acrylic resin, an epoxy resin or the like that is an ultraviolet setting type can be enumerated. Also, as the thermosetting type resin, a polyimide resin or the like that is a thermosetting type can be enumerated. Furthermore, for example, the first insulation layer 40 may be composed of a laminated layered film using a plurality of the materials described above.

In this exemplary embodiment, the case where a precursor of polyimide resin is used as the material for forming the insulation layer 40 is described. First, for example, by using a spin coat method, the precursor (precursor of polyimide resin) is coated on the semiconductor substrate 11, thereby forming a precursor layer. In this instance, the precursor layer is formed in a manner to cover the upper surface of the first columnar section P1. It is noted that, as the method for forming the precursor layer, besides the aforementioned spin coat method, another known technique, such as, a dipping method, a spray coat method, an ink jet method or the like can be used. Then, the semiconductor substrate 11 is heated by using, for example, a hot plate or the like, thereby removing the solvent, and then is placed in a furnace at about 350° C. to thereby imidize the precursor layer, whereby a polyimide resin layer that is almost completely set is formed. Then, as shown in FIG. 11A, the polyimide resin layer is patterned by using a known lithography technique, thereby forming the insulation layer 40.

As the etching method used for patterning, a dry etching method or the like can be used. Dry etching can be conducted with, for example, oxygen or argon plasma. In the method for forming the insulation layer 40 described above, an example in which a precursor layer of polyimide resin is hardened and then patterning is conducted is described. However, before hardening the precursor layer of polyimide resin, patterning may be conducted. As the etching method used for this patterning, a wet etching method or the like may be used. The wet etching may be conducted with, for example, an alkaline solution or an organic solution.

Figure 11B:
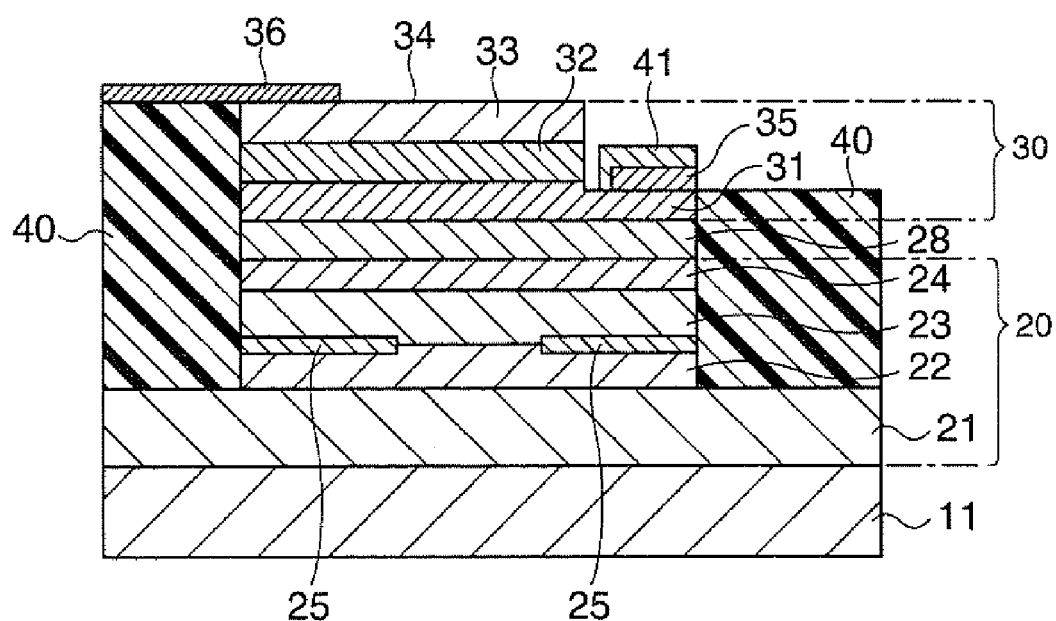

When the steps described above are completed, an electrode 35 is formed on the top surface of the first contact layer 31, as shown in FIG. 11B. When the electrode 35 is formed, an electrode 27 on the first mirror 21 is also concurrently formed. Then, an electrode 36 on the second contact layer 31 is formed. When the electrode 36 formed, an electrode 26 on the contact layer 24 is also concurrently formed. As a result, the electrode 26 and the electrode 35 are alternately formed around the laser light emission surface 34, as shown in FIG. 4A and FIG. 5.

In accordance with an exemplary method, the electrodes 27 and 35 may be formed as follows. First, before forming the electrode 27 and the electrode 35, the top surface of the first mirror 21 and the top surface of the first contact layer 31 are washed by a plasma processing method or the like, if necessary. As a result, an element with more stable characteristics can be formed. Next, a laminated film of an alloy of chrome (Cr), gold (Au) and germanium (Ge), nickel (Ni) and gold (Au), for example, is formed by, for example, a vacuum deposition method. Then, the electrodes 27 and the electrode 35 are formed by removing the laminated film other than specified positions by a lift-off method.

Also, an exemplary method for forming the electrodes 26 and 36 may be conducted as follows. First, before forming the electrode 26 and the electrode 36, the top surface of the contact layer 24 and the top surface of the second contact layer 33 are washed by a plasma processing method or the like, if necessary. As a result, an element with more stable characteristics can be formed. Next, a laminated film of an alloy of chrome (Cr), gold (Au) and zinc (Zn), and gold (Au), for example, is formed by, for example, a vacuum deposition method. Then, the electrodes 26 and the electrode 36 are formed by removing the laminated film other than specified positions by a lift-off method.

However, the electrode 26 needs to be formed in a manner not to contact the first contact layer 31. This is because the electrode 26 contains zinc (Zn). In other words, if the electrode 26 is in contact with the first contact layer 31, zinc, as being p-type dopant for the first contact layer 31 composed of a GaAs layer, may change the n-type characteristic of the first contact layer 31 to the p-type characteristic. As a result, the pin structure in the photodetecting element 30 may be destroyed.

It is noted that a dry etching method or a wet etching method can be used in the above-described process of forming the electrodes 27 and 35 and the electrodes 26 and 36, instead of the lift-off method. Also, in the process described above, a sputtering method can be used instead of the vapor deposition method. Further, in the process described above, the electrodes 27 and 35 are patterned at the same time, and the electrodes 26 and 36 are patterned at the same time. However, these electrodes may be formed individually. Also, in the process described above, the electrodes 27 and 35 are formed first, and then the electrodes 26 and 36 are formed. However, the electrodes 26 and 36 may be formed first, and then the electrodes 27 and 35 may be formed.

When the process described above is complete, an additional electrode 41 is formed, as shown in FIG. 11B. The additional electrode 41 is formed in a manner to electrically connect the electrode 26 of the surface-emitting type semiconductor laser 20 and the electrode 35 of the photodetecting element 30. More specifically, in a manner similar to the case of forming each of the electrodes, the semiconductor substrate 11 is washed by using a plasma treatment method or the like, if necessary. Then, for example, a vacuum deposition method may be used to form a metal film composed of, for example, chrome (Cr) and gold (Au). Then, a lift-off method or the like is conducted to thereby remove the metal film in portions other than the specified positions, whereby an additional electrode 41 is formed. It is noted that the additional electrode 41 may be formed in a manner to cover the entire top surface of the electrode 26 and the electrode 35, or may be formed such that a portion of the top surface of the electrode 26 and the electrode 35 is exposed.

Finally, an annealing treatment is conducted. The temperature of the annealing treatment depends on the electrode material. The annealing treatment is usually conducted at about 400° C. for the electrode material used in the present embodiment. If necessary, the annealing treatment may be conducted before forming the additional electrode 41. By the process described above, the optical semiconductor element 10 shown in FIGS. 1-3 in accordance with the present embodiment is manufactured.

In the optical semiconductor element 10 in accordance with the embodiment of the invention described above, the additional electrode 41 is formed on the electrode 26 and the electrode 35, such that, even when the electrode 26 and the electrode 35 are formed in a manner to contact each other, good connection property can be obtained. In other words, by forming the additional electrode 41, the electrode 26 and the electrode 35 can be formed in contact with each other. This makes it unnecessary to consider margins of masks to be used for forming each of the electrodes, which consequently facilitates the fabrication and improves the yield.

Further, in the optical semiconductor element 10 in accordance with the present embodiment described above, the first contact layer 31 of the photodetecting element 30 is included in the first columnar section P1. Also, as described above, the electrode 26 and the electrode 35 can be formed in contact with each other. Accordingly, the bonding area of each of the electrodes can be widened, and for example, the resistance of the photodetecting element 30 can be reduced. As a result, the photodetecting element 30 with low resistance and excellent characteristics can be obtained.

Also, because the additional electrode 41 is formed in a manner to cover the electrode 26 and the electrode 35, adhesion of the electrode 26 and the electrode 35 can be increased, and oxidation of the electrode 26 and the electrode 35 can be prevented. Accordingly, metal wirings (bonding wires) that are electrically connected to these electrodes can have a higher bonding strength, whereby the reliability of the optical semiconductor element 10 can be improved. As a result, highly reliable optical semiconductor elements 10 can be manufactured with high yield.

Although the embodiments of the invention are described above, the invention is not limited to the embodiments described above, and many modifications can be freely made within the scope of the invention. For example, in the embodiment described above, the photodetecting element 30 is provided to detect the optical intensity of laser light emitted from the surface-emitting type semiconductor laser 20. However, the photodetecting element 30 may be used to detect light coming from outside. More concretely, for example, the optical element may be used for optical communications, laser light emitted from the surface-emitting type semiconductor laser 20 may be used as optical signals to be transmitted, and the photodetecting element 30 can be used to detect optical signals transmitted from outside. The optical signals detected by the photodetecting element 30 are retrieved from the electrodes 35 and 36 as electrical signals. Moreover, interchanging the p-type and n-type characteristics in each of the semiconductor layers does not deviate from the scope of the invention.

What is claimed is:

1. An optical semiconductor element comprising:
   a surface-emitting type semiconductor laser that emits laser light;
   a photodetecting element formed above the surface-emitting type semiconductor;
   a first electrode of a first polarity formed on the surface-emitting type semiconductor laser;
   a second electrode of a second polarity different from the first polarity formed on the photodetecting element;
   an additional electrode that covers the first electrode and the second electrode;
   a first columnar section including at least a portion of the surface-emitting type semiconductor laser and a portion of the photodetecting element; and
   a second columnar section that is formed above the first columnar section, has a cross-sectional area smaller than a cross-sectional area of the first columnar section, and includes another remaining portion of the photodetecting element;
   wherein the photodetecting element includes a first semiconductor layer composed of a first conductivity type, a second semiconductor layer that functions as an absorption layer, and a third semiconductor layer composed of a second conductivity type, wherein the first semiconductor layer is included in the first columnar section, and the second semiconductor layer and the third semiconductor layer are included in the second columnar section;
   wherein the second electrode is formed on the first semiconductor layer included in the first columnar section; and
   wherein the first semiconductor layer included in the first columnar section has an outer circumferential portion formed in a comb teeth shape around the emission surface, wherein the first electrode is formed in gaps of the comb teeth shape of the first semiconductor layer.

* * * * *